(12) United States Patent
Li et al.

(10) Patent No.: US 10,742,255 B2
(45) Date of Patent: Aug. 11, 2020

(54) DATA COMPRESSION METHOD AND DEVICE

(71) Applicant: DATANG MOBILE COMMUNICATIONS EQUIPMENT CO., LTD, Beijing (CN)

(72) Inventors: Qinghua Li, Beijing (CN); Huarong Sun, Beijing (CN)

(73) Assignee: DATANG MOBILE COMMUNICATIONS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 16/485,444

(22) PCT Filed: Jan. 23, 2018

(86) PCT No.: PCT/CN2018/073859
§ 371 (c)(1),
(2) Date: Aug. 13, 2019

(87) PCT Pub. No.: WO2018/145570
PCT Pub. Date: Aug. 16, 2018

(65) Prior Publication Data
US 2020/0007185 A1    Jan. 2, 2020

(30) Foreign Application Priority Data

Feb. 13, 2017    (CN) .......................... 2017 1 0075836

(51) Int. Cl.
*H04J 14/00*    (2006.01)
*H04B 1/66*    (2006.01)
*H04B 10/2575*    (2013.01)

(52) U.S. Cl.
CPC ......... *H04B 1/66* (2013.01); *H04B 10/25753* (2013.01)

(58) Field of Classification Search
CPC ............................ H03M 7/3059; H03M 7/30; H04B 10/25753; H04B 10/5055; H04B 10/516;
(Continued)

(56) References Cited

U.S. PATENT DOCUMENTS 6,556,965 B1* 4/2003 Borland .................. G10L 19/02
704/200.1
7,116,917 B2* 10/2006 Miyamoto ......... H04B 10/5051
398/185
(Continued)

FOREIGN PATENT DOCUMENTS

CN    100553244 C    10/2009
CN    101588653 A    11/2009
(Continued)

*Primary Examiner* — Hibret A Woldekidan
(74) *Attorney, Agent, or Firm* — Kilpatrick Townsend & Stockton, LLP

(57) ABSTRACT

The present disclosure relates to the field of mobile communications, and in particular, to a data compression method and device. In order to solve the problem of low compression efficiency in the prior art, the method comprises: sampling an obtained baseband signal and obtaining a number of discrete baseband signals to achieve an initial compression; calculating amplitude and phase values of each discrete baseband signal, on the basis of bit widths preset for the adjusted amplitude value and the phase value, carrying out a bit-truncating on the adjusted amplitude value and the phase value respectively, and combining the truncated phase value data and amplitude value data to obtain the final compressed discrete baseband signal. In this way, by truncating bits according to the preset bit width without distortion, the data bits of the baseband signal can be reduced accordingly, thereby reducing the amount of transmitted data, effectively improving the compression efficiency, and thus saving fiber resources.

12 Claims, 4 Drawing Sheets

(58) Field of Classification Search
CPC ... H04B 1/66; H04J 14/08; H04J 14/00; H04J 14/005; H04L 27/26; H04L 27/38; H04L 29/08
USPC .......................... 398/43, 208, 210, 188, 202
See application file for complete search history.

(56) References Cited

U.S. PATENT DOCUMENTS

| | | | | |
|---|---|---|---|---|
| 9,026,236 | B2* | 5/2015 | Ishikawa | G10L 21/04 |
| | | | | 700/94 |
| 9,071,490 | B2* | 6/2015 | Lim | H04L 27/2624 |
| 2006/0067709 | A1* | 3/2006 | Newberg | H01Q 3/2676 |
| | | | | 398/188 |
| 2009/0074407 | A1* | 3/2009 | Hornbuckle | H04L 27/2067 |
| | | | | 398/43 |
| 2011/0123192 | A1* | 5/2011 | Rosenthal | H03M 1/121 |
| | | | | 398/43 |
| 2012/0301136 | A1* | 11/2012 | Chang | H04B 7/0413 |
| | | | | 398/16 |
| 2013/0045015 | A1* | 2/2013 | Kuschnerov | H04B 10/61 |
| | | | | 398/208 |
| 2015/0358030 | A1* | 12/2015 | Xia | H04L 27/2626 |
| | | | | 341/87 |

FOREIGN PATENT DOCUMENTS

| | | |
|---|---|---|
| CN | 102340471 A | 1/2012 |
| CN | 102843720 A | 12/2012 |
| CN | 103036835 A | 4/2013 |
| CN | 103812608 A | 5/2014 |
| CN | 103888146 A | 6/2014 |
| CN | 103905122 A | 7/2014 |
| CN | 104378117 A | 2/2015 |
| CN | 104821861 A | 8/2015 |
| WO | 2013044492 A1 | 4/2013 |

* cited by examiner

DATA COMPRESSION METHOD AND DEVICE

This application is a National Stage of International Application No. PCT/CN2018/073859, filed Jan. 23, 2018, which claims the priority of Chinese Patent Application No. 201710075836.1, filed with the Chinese Patent Office on Feb. 13, 2017, and entitled "A method and device for compressing data", both of which are hereby incorporated by reference in their entireties.

FIELD

The present disclosure relates to the field of mobile communications, and particularly to a method and device for compressing data.

BACKGROUND

As the Time Division-Long Term Evolution (TD-LTE) system and the 5G system are advancing, there is a higher requirement on data transmission, and correspondingly there is a higher requirement on data transmission through optic fibers in a base station responsible of transmitting data in the TD-LTE system or the 5G system.

Generally the requirement on data transmission can be satisfied by increasing the number of optic fibers, but this will greatly increase a cost.

In a mobile communication system, data are generally transmitted by a base station, and an indoor Base Band Unit (BBU) and a Remote Radio Unit (RRU) are responsible for baseband processing and radio frequency processing functions of the base station respectively, where data generally including operation and maintenance data and IQ signals (baseband signals) are transmitted between the BBU and the RRU through an optic fiber, and an interface between them is referred to as an IR interface. At present, generally original data are transmitted between respective base stations, and in the prior art, the data can be compressed through an IR interface so that a large amount of data can be transmitted reliably and efficiently in a limited bandwidth, but the amount of data can only be reduced by a factor of ½ in the existing compression method.

In the TD-LTE system or the 5G system, the largest sampling width of an IQ signal is 16 bits, and in order to transmit an IQ signal through an optic fiber, it shall be 8/10-encoded (8-bit data are converted into 10-bit data for transmission), so the highest air-interface transmission rate of an 8-antenna device in the TD-LTE standard or the 5G standard can be calculated as 9.8304 Gbps in the equation of:

30.72M*32 bits*8 antennas*(10/8)=9.8304 Gbps.

A 10G optic fiber will suffice if it is still used in a 4G system, but the TD-LTE system or the 5G system is provided with a 25G optic fiber, and in order to transmit an IQ signal through a 25G optic fiber, it shall be 64/66-encoded (64-bit data are converted into 66-bit data), which is equivalent to three 10G optic fibers, so a 64-antenna 3D-MIMO device in the 5G system shall be provided with three 25G optic fibers to transmit a signal which is not compressed; and if the signal is compressed in the existing method (the amount of data is reduced by a factor of ½), then the device still shall be provided with two 25G optic fibers, and since the requirement on signal transmission still cannot be satisfied using a single 25G optic fiber, data shall be compressed more efficiently so that the requirement on signal transmission still can be satisfied using a single 25G optic fiber.

Accordingly it is desirable to provide a new method for compressing data so as to improve the compression efficiency.

SUMMARY

Embodiments of the disclosure provide a method and device for compressing data so as to address the problems in the prior art that the requirement on data transmission cannot be satisfied using a single 25G optic fiber when the respective base stations in the existing communication system transmit data through an optic fiber, and the data cannot be compressed efficiently in the existing compression method.

Particular technical solutions according to the embodiments of the disclosure are as follows.

An embodiment of the disclosure provides a method for compressing data, the method including:

obtaining a baseband signal;

sampling obtained baseband signal to obtain several discrete baseband signals;

calculating a phase and an amplitude of each of the discrete baseband signals, and adjusting the amplitude of each of the discrete baseband signals respectively so that adjusted amplitude satisfies a preset peak-to-average ratio; and performing respectively for each of the discrete baseband signals operations of:

bit-truncating the phase and the adjusted amplitude corresponding respectively to each of discrete baseband signals according to bit widths which are set respectively corresponding to the phase and the adjusted amplitude, and combining bit-truncated phase and bit-truncated amplitude into a compressed discrete baseband signal.

Optionally, sampling the baseband signal to obtain the several discrete baseband signals includes:

sampling the baseband signal at a preset sampling rate to obtain a sampling result, wherein the sampling rate satisfies the Nyquist's Theorem; and filtering the sampling result to obtain the several discrete baseband signals.

Optionally, calculating the phase and the amplitude of each discrete baseband signal, and adjusting the amplitude of each discrete baseband signal respectively so that the adjusted amplitude satisfies the preset peak-to-average ratio includes:

converting each of the discrete baseband signals from a time domain into amplitude and phase domains to obtain a phase and an amplitude, determining an amplitude power average based upon the amplitude, calculating a difference between the amplitude power average and a preset power average based upon the amplitude power average and the preset power average, and scaling up or down the amplitude corresponding to each of the discrete baseband signals based upon the difference; or converting each of the discrete baseband signals from a time domain into amplitude and phase domains to obtain a phase and an amplitude, determining a amplitude power average based upon the amplitude, determining whether the amplitude power average is greater than a preset power average, and if so, saturating the amplitude power average of each of the discrete baseband signals, and adjusting the amplitude; otherwise, maintaining the amplitude corresponding to each of the discrete baseband signals.

Optionally, before bit-truncating the phase and the adjusted amplitude of each of the discrete baseband signals respectively, the method further includes:

preprocessing each of the discrete baseband signals to thereby maximize valid bit widths corresponding respectively to the phase and the adjusted amplitude of each of the discrete baseband signals.

Optionally, bit-truncating the phase and the adjusted amplitude corresponding respectively to each of the discrete baseband signals according to the bit widths which are set respectively corresponding the phase and the adjusted amplitude includes:

removing a sign bit of the adjusted amplitude of each of the discrete baseband signals, and saturating the adjusted amplitude; and adjusting the adjusted amplitude corresponding to each of the discrete baseband signals, with one sign bit according to the bit width which is set for the adjusted amplitude, bit-truncating lower bits of the adjusted amplitude from which the sign bit is removed, according to the adjusted bit width, and bit-truncating the phase of each of the discrete baseband signals according to the bit width which is set for the phase of each of the discrete baseband signal.

Optionally, removing the sign bit of the adjusted amplitude of each of the discrete baseband signals, and saturating the adjusted amplitude includes:

determining whether the adjusted amplitude of each of the discrete baseband signals overflows after the sign bit is removed, and if so, determining a saturation value corresponding to overflowing amplitude as the adjusted amplitude from which the sign bit is removed; otherwise, not processing the adjusted amplitude.

An embodiment of the disclosure provides a device for compressing data, the device including:

an obtaining unit configured to obtain a baseband signal;

a sampling unit configured to sample obtained baseband signal to obtain several discrete baseband signals;

a converting unit configured to calculate a phase and an amplitude of each of the discrete baseband signal, and to adjust the amplitude of each of the discrete baseband signal respectively so that adjusted amplitude satisfies a preset peak-to-average ratio; and a processing unit configured to perform respectively for each of the discrete baseband signals operations of:

bit-truncating the phase and the adjusted amplitude corresponding respectively to each of the discrete baseband signals according to bit widths which are set respectively corresponding to the phase and the adjusted amplitude, and combining the bit-truncated phase and amplitude into a compressed discrete baseband signal.

Optionally, the sampling unit is configured to sample the obtained baseband signal to obtain the several discrete baseband signals by:

sampling the baseband signal at a preset sampling rate to obtain a sampling result, wherein the sampling rate satisfies the Nyquist's Theorem; and filtering the sampling result to obtain the several discrete baseband signals.

Optionally, the converting unit is configured to calculate the phase and the amplitude of each of the discrete baseband signals, and to adjust the amplitude of each discrete baseband signal respectively so that the adjusted amplitude satisfies the preset peak-to-average ratio by:

converting each of the discrete baseband signals from a time or frequency domain into amplitude and phase domains to obtain the phase and amplitude, determining an amplitude power average based upon the amplitude, calculating a difference between the amplitude power average and a preset power average based upon the amplitude power average and the preset power average, and scaling up or down the amplitude corresponding to each of the discrete baseband signal based upon the difference; or converting each of the discrete baseband signal from a time domain into amplitude and phase domains to obtain the phase and amplitude, determining an amplitude power average based upon the amplitude, determining whether the amplitude power average is greater than a preset power average, and if so, saturating the amplitude power average of the discrete baseband signal, and adjusting the amplitude; otherwise, maintaining the amplitude corresponding to each of the discrete baseband signal.

Optionally, before the phase and the adjusted amplitude of each discrete baseband signal are bit-truncated respectively, the processing unit is configured:

to preprocess each of the discrete baseband signal to thereby maximize valid bit widths corresponding respectively to the phase and the adjusted amplitude of each of the discrete baseband signals.

Optionally, the processing unit is configured to bit-truncate the phase and the adjusted amplitude corresponding respectively to each of the discrete baseband signals according to the bit widths which are set respectively corresponding the phase and the adjusted amplitude by:

removing a sign bit of the adjusted amplitude of each of the discrete baseband signals, and saturating the adjusted amplitude; and adjusting the adjusted amplitude corresponding to each of the discrete baseband signals, with one sign bit according to the bit width which is set for the adjusted amplitude, bit-truncating lower bits of the adjusted amplitude from which the sign bit is removed, according to the adjusted bit width, and bit-truncating the phase of each of the discrete baseband signals according to the bit width which is set for the phase of each of the discrete baseband signal.

Optionally, the processing unit is configured to remove the sign bit of the adjusted amplitude of each of the discrete baseband signal, and to saturate the adjusted amplitude by determining whether the adjusted amplitude of each of the discrete baseband signal overflows after the sign bit is removed, and if so, determining a saturation value corresponding to an overflowing amplitude as the adjusted amplitude from which the sign bit is removed; otherwise, not to processing the adjusted amplitude.

In summary, in the embodiments of the disclosure, firstly an obtained baseband signal is sampled, and several discrete baseband signals are obtained, so that the baseband signal can be compressed for the first time without being distorted; then the amplitude and the phase of each discrete baseband signal are calculated, and the amplitude is adjusted based upon a preset peak-to-average ratio while maintaining the phase; and next the adjusted amplitude and the phase are bit-truncated respectively according to bit widths which are preset for the adjusted amplitude and the phase, and bit-truncated phase data and amplitude data are combined into a compressed discrete baseband signal, so that the amplitude and the phase of each discrete baseband signal can be bit-truncated according to their preset bit widths without being distorted, to thereby reduce the number of data bits in the baseband signal so as to reduce the amount of data to be transmitted, and to improve in effect the compression efficiency, thus saving optic fiber resources, and achieving compatibility with the existing TD-LTE system or 5G system. In this way, the existing communication system architecture will not be modified, thus saving the cost.

DETAILED DESCRIPTION OF THE EMBODIMENTS

Figure 1:
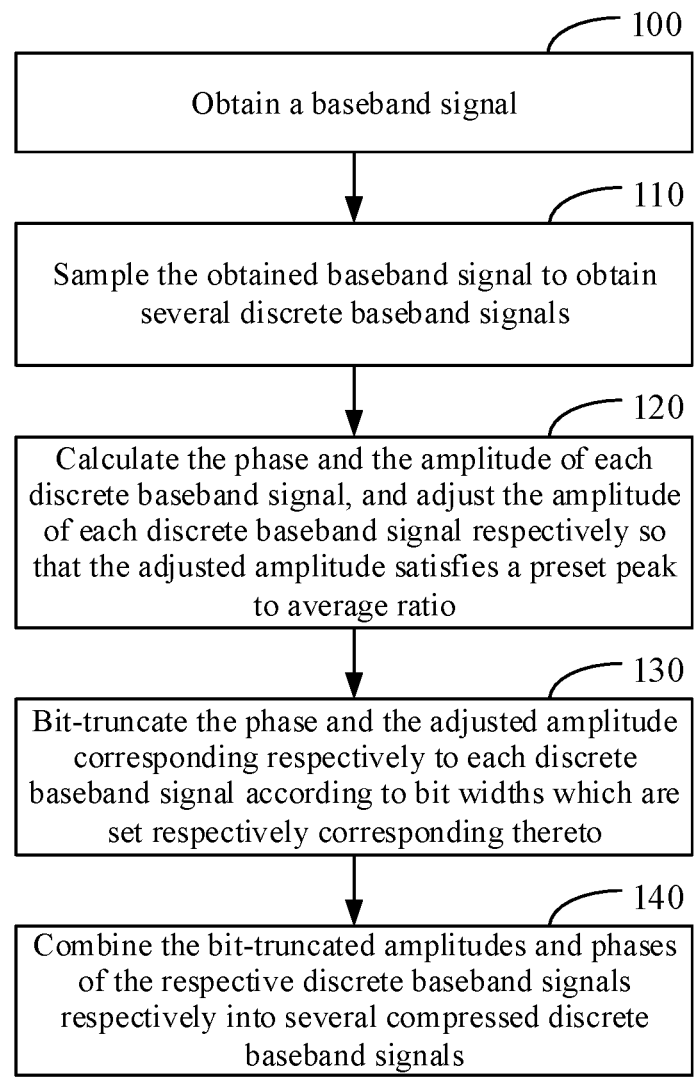
FIG. 1 is a flow chart of a method for compressing data according to an embodiment of the disclosure.

In order to make the objects, technical solutions, and advantages of the embodiments of the disclosure more apparent, the technical solutions according to the embodiments of the disclosure will be described below clearly and fully with reference to the drawings in the embodiments of the disclosure, and apparently the embodiments to be described below are only a part but not all of the embodiments of the disclosure. Based upon the embodiments here of the disclosure, all the other embodiments which can occur to those ordinarily skilled in the art without any inventive effort shall fall into the scope of the disclosure.

It shall be appreciated that the technical solutions according to the embodiments of the disclosure can be applicable to various communication systems, e.g., a Global System of Mobile communication (GSM) system, a Code Division Multiple Access (CDMA) system, a Wideband Code Division Multiple Access (WCDMA) system, a General Packet Radio Service (GPRS) system, a Long Term Evolution (LTE) system, a Long Term Evolution-Advanced (LTE-A) system, a Universal Mobile Telecommunication System (UMTS), etc.

It shall be further appreciated that in the embodiments of the disclosure, a User Equipment (UE) includes but will not be limited to a Mobile Station (MS), a mobile terminal, a mobile telephone, a handset, a portable equipment, etc., and the user equipment can communicate with one or more core networks over a Radio Access Network (RAN). For example, the user equipment can be a mobile phone (referred to as a "cellular" phone), a computer with a function of radio communication, etc., and the user equipment can also be a portable, pocket, handheld, built-in-computer, or on-vehicle mobile device.

In the embodiments of the disclosure, a base station (e.g., an access point) can be such a device in an access network that communicates with a radio terminal over one or more sectors via an air interface. The base station can be configured to convert a received air frame into an IP packet, and a received IP packet into an air frame, and operate as a router between the radio terminal, and the remaining components of the access network, where the remaining components of the access network can include an Internet Protocol (IP) network. The base station can further coordinate attribute management on the air interface, and for example, the base station can be a Base Communication module Station (BTS) in a GSM or CDMA system, or can be a base station (Node B) in a WCDMA system, or can be an evolved base station (Node B or eNB or e-Node B) in an LTE system, although the disclosure will not be limited thereto.

In order to address the problems in the prior art that the requirement on data transmission cannot be satisfied using a single 25G optic fiber when the respective base stations in the existing communication system transmit data through an optic fiber, and the data cannot be compressed efficiently in the existing compression method, such a method for compressing data is provided in the embodiments of the disclosure that firstly a baseband signal is sampled and preliminarily compressed, and then the amplitude of the baseband signal is adjusted so that the adjusted amplitude satisfies a preset peak-to-average ratio while maintaining the phase thereof; and next the phase and the adjusted amplitude are bit-truncated according to bit widths which are set respectively corresponding thereto so that the baseband signal is further compressed.

The technical solutions according to the embodiments of the disclosure will be described below clearly and fully with reference to the drawings in the embodiments of the disclosure, and apparently the embodiments to be described below are only a part but not all of the embodiments of the disclosure. Based upon the embodiments here of the disclosure, all the other embodiments which can occur to those ordinarily skilled in the art without any inventive effort shall fall into the scope of the disclosure.

The inventive solutions will be described below in details in connection with particular embodiments thereof, and of course, the disclosure will not be limited thereto.

As illustrated in FIG. 1, a flow of a method for compressing data according to an embodiment of the disclosure is as follows.

The step 100 is to obtain a baseband signal.

Particularly in the embodiment of the disclosure, the baseband signal refers to an In-Phase Quadrature (IQ) signal including two signal branches, i.e., an I signal and a Q signal.

For example, a sampling rate in an LTE system operating in a 20 M bandwidth is 30.72 Msps, and at this time, a data transmission bandwidth to be provided through a single optic fiber between a BBU and an RRU can be represented in the equation of 30.72 Msps×16 bit×2, where:

"30.72 Msps" represents the current sampling rate, "16 bits" represents the current sampling width of the system, and "2" represents the total number of existing signal branches.

The step 110 is to sample the obtained baseband signal to obtain several discrete baseband signals.

Particularly, the baseband signal is sampled at a preset sampling rate to obtain a sampling result, where the sampling rate satisfies the Nyquist's Theorem, and the sampling result is filtered to obtain the several discrete baseband signals.

For example, the sampling rate of 30.72 Msps in the LTE system operating in the 20 M bandwidth has been lowered to 20.48 Msps so that the data transmission bandwidth to be provided through a single optic fiber between a BBU and an RRU can be represented in the equation of 20.48 Msps×16 bit×2, "20.48 Msps" represents the current sampling rate, "16 bits" represents the current sampling width of the system, and "2" represents the total number of existing signal branches.

The data transmission bandwidth to be provided through a single optic fiber between a BBU and an RRU has been lowered by a factor of ⅓ as compared with the original baseband signal in the step 10, so data can be compressed by a factor of ⅔.

The step 120 is to calculate the phase and the amplitude of each discrete baseband signal, and to adjust the amplitude of each discrete baseband signal respectively so that the adjusted amplitude satisfies a preset peak-to-average ratio.

Particularly, the phase and the amplitude of each discrete baseband signal are calculated, and the amplitude of each discrete baseband signal is adjusted respectively so that the adjusted amplitude satisfies the preset peak-to-average ratio; and in the embodiment of the disclosure, a discrete baseband signal can be regarded as an Orthogonal Frequency Division Multiplexing (OFDM) symbol, or a Single-Carrier Frequency Division Multiple Access (SC-FDMA) symbol, in the LTE system, or can be regarded as a timeslot or a sub-frame in a 3G system, although the embodiment of the disclosure will not be limited thereto. The phase and the amplitude of a discrete baseband signal can be obtained, and the amplitude can be adjusted, particularly in the following two implementations.

In a first implementation:

a discrete baseband signal is converted from the time domain into the amplitude and phase domains to obtain the corresponding phase and amplitude, a corresponding amplitude power average is determined based upon the amplitude, the difference between the amplitude power average and a preset power average is calculated based upon the amplitude power average and the preset power average, and the amplitude corresponding to the discrete baseband signal is scaled up or down based upon the difference.

Furthermore, a discrete baseband signal is converted from the time domain into the amplitude and phase domains so that the baseband signal is converted from a Cartesian coordinate system into a polar coordinate system to obtain the corresponding phase and amplitude.

In the embodiment of the disclosure, the baseband signal is buffered for a length of 128 points starting with a half of the length of a Cyclic Prefix (CP), starting with a start instance of time of an OFDM symbol, and then a statistics is made of power at the amplitudes of the 128 points to obtain an amplitude power average, i.e., a Root Mean Square (RMS) value, where the preset power average is −13.5 dB (derived empirically).

For example, the RMS value of an OFDM symbol 1 is calculated as −53.5 dB, and the difference between the RMS value and the preset power average of −13.5 dB is 40 dB, so the amplitude of the OFDM symbol 1 can be scaled up to the preset power average by a factor of 100, where the amplitude scaling factor can be determined in the equation of:

$$20*\log_{10}(\text{Amplitude scaling factor})=\text{Scaling factor in dB}.$$

In the equation above, "Scaling factor in dB" is particularly "40 dB", so that the amplitude scaling factor can be calculated as "100".

In a second implementation, a discrete baseband signal is converted from the time domain into the amplitude and phase domains to obtain the corresponding phase and amplitude, a corresponding amplitude power average is determined based upon the amplitude, it is determined whether the amplitude power average is greater than a preset power average, and if so, then the amplitude power average of the discrete baseband signal will be saturated, and the corresponding amplitude will be adjusted; otherwise, the amplitude corresponding to the discrete baseband signal will be maintained.

In the embodiment of the disclosure, a preset power peak is set according to a peak-to-average ratio characteristic of the LTE system.

For example, the preset power peak is −13.5 dB, and if the amplitude power average of the current OFDM symbol is calculated as −53.5 dB, then the current amplitude will be saturated, a target amplitude power average will be determined as −13.5 dbFS, and the current amplitude will be scaled down by a factor of 100.

In another example, the preset power peak is −53.5 dB, and if the amplitude power average of the current OFDM symbol is calculated as −43.5 dB, then the amplitude of the current OFDM symbol will be maintained instead of being adjusted.

The step 130 is to bit-truncate the phase and the adjusted amplitude corresponding respectively to each discrete baseband signal according to bit widths which are set respectively corresponding thereto.

Particularly, before the phase and the adjusted amplitude corresponding respectively to each discrete baseband signal are bit-truncated, each discrete baseband signal shall be preprocessed to thereby maximize valid bit widths corresponding respectively to the phase and the adjusted amplitude of each discrete baseband signal.

Furthermore, for an OFDM symbol, for example, the sign bit of the adjusted amplitude thereof is removed, and the adjusted amplitude is saturated; and then the adjusted amplitude corresponding to the discrete baseband signal is adjusted with one sign bit according to the bit width which is set for the amplitude, lower bits of the adjusted amplitude from which the sign bit is removed are bit-truncated according to the adjusted bit width, and the phase of the discrete baseband signal is bit-truncated according to the bit width which is set for the phase.

Particularly, in order to remove the sign bit of the adjusted amplitude, it shall be determined whether the adjusted amplitude overflows after the sign bit is removed, and if so, then the adjusted amplitude from which the sign bit is removed will be determined as the overflowing amplitude which is saturated; otherwise, the adjusted amplitude will not be processed.

For example, the bit width preset for the adjusted amplitude is 8 bits, and the bit width preset for the phase thereof, so in correspondence to the first implementation of the step 102, after the amplitude power average of the current OFDM symbol is adjusted to −13.5 dB, the uppermost sign bit among the 16 bits is removed, and the amplitude power average is saturated, and then the 7 lower bits are bit-truncated and rounded off, thus resulting in 8-bit amplitude data, and 8 bits are removed from the phase, thus resulting in 8-bit phase data.

The step 140 is to combine the bit-truncated amplitudes and phases of the respective discrete baseband signals respectively into several compressed discrete baseband signals.

Particularly, the amplitudes and the phases are bit-truncated into the data with the corresponding bit widths, and the bit-truncated amplitudes and phases of the respective discrete baseband signals are combined respectively into the several compressed discrete baseband signals.

For example, if the bit-truncated amplitude includes 7 bits, and the bit-truncated phase includes 8 bits, then they will be combined into 15-bit IQ signal data, so the data transmission bandwidth to be provided through a single optic fiber between a BBU and an RRU can be represented in the equation of 20.48 Msps×15 bit, where:

"20.48 Mbps" represents the current sampling rate, and "15 bits" represents the current sampling width of the system, so the data transmission bandwidth to be provided through a single optic fiber between a BBU and an RRU has been lowered by a factor of ⅔ as compared with the original IQ signals in the step 100, and thus data can be compressed by a factor of ⅓. As can be apparent from the equation above, the original two signal branches, i.e., the I and Q signals, can be compressed into one signal branch, i.e., the IQ signal, so the sampling width can also be reduced.

In another example, if the bit-truncated amplitude includes 7 bits, and the bit-truncated phase includes 7 bits, then they will be combined into 14-bit IQ signal data, so the data transmission bandwidth to be provided through a single optic fiber between a BBU and an RRU can be represented in the equation of 20.48 Msps×14 bit, where:

"20.48 Mbps" represents the current sampling rate, and "14 bits" represents the current sampling width of the system, so the data transmission bandwidth to be provided through a single optic fiber between a BBU and an RRU has been lowered by a factor of ¾ as compared with the original IQ signals in the step 100, and thus data can be compressed by a factor of ¼. As can be apparent from the equation above, the original two signal branches, i.e., the I and Q signals, can be compressed into one signal branch, i.e., the IQ signal, so the sampling width can also be reduced.

In another example, as our tests demonstrated, when data are compressed by a factor of ⅓, an Error Vector Magnitude (EVM) value is approximately 1.6%, and when data are compressed by a factor of ¼, the EVM value is approximately 4%, so there is low distortion while the data are being transmitted.

Of course, in the embodiment of the disclosure, after the step 120 is performed, the amplitude or amplitudes of one more of the several discrete baseband signals are adjusted to the appropriate peak-to-average ratio, the one or more discrete baseband signals can be further recovered from the polar coordinate system into the Cartesian coordinate system, that is, from the amplitude and phase domains into the time (or frequency) domain; and then the discrete baseband signal (the IQ signal) can be bit-truncated directly according to a preset bit width instead of bit-truncating the corresponding amplitude and phase respectively.

In another example, the bit widths of the discrete baseband signals are the same as in the step 110 after the step 120 is performed, and in the example of the step 110 again, the preset bit width is 8 bits, for example, and a 16-bit discrete baseband signal is bit-truncated directly into 8 bits, that is, the data transmission bandwidth of "20.48 Msps×16 bit×2" is reduced to "20.48 Msps×8 bit×2", so the data transmission bandwidth to be provided through a single optic fiber between a BBU and an RRU has been lowered by a factor of ⅔ as compared with the initial data transmission bandwidth of "30.72 Msps×16 bit×2" as required, so data can be compressed by a factor of ⅓.

In another example, the preset bit width is 7 bits, for example, and a 16-bit discrete baseband signal is bit-truncated directly into 7 bits, that is, the data transmission bandwidth of "20.48 Msps×16 bit×2" is reduced to "20.48 Msps×7 bit×2", so the data transmission bandwidth to be provided through a single optic fiber between a BBU and an RRU has been lowered by a factor of ¾ as compared with the initial data transmission bandwidth of "30.72 Msps×16 bit×2" as required, so data can be compressed by a factor of ¼.

Accordingly both bit-truncation of the amplitudes and the phases respectively in the polar coordinate system, and bit-truncation of the discrete baseband signals respectively in the Cartesian coordinate system shall fall into the claimed scope of the disclosure.

Figure 2:
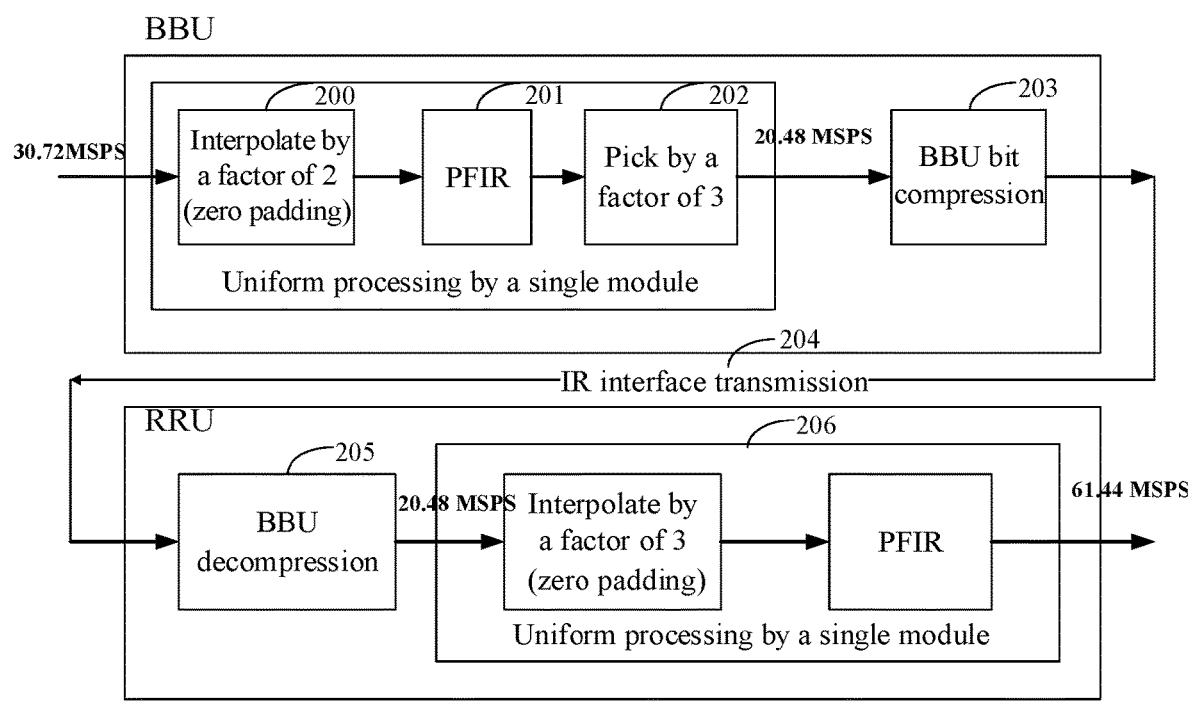
FIG. 2 is a schematic diagram of a process of compressing uplink transmission data according to an embodiment of the disclosure.

The embodiment above of the disclosure will be described below in further details in connection with particular implementation scenarios thereof First Scenario (Downlink Transmission):

as illustrated in FIG. 2, a process of compressing data in downlink transmission of a BBU to an RRU according to an embodiment of the disclosure is as follows.

The step 200 is to interpolate zeros into an input baseband signal to form the baseband signal at a sampling rate of 61.44 Msps.

The step 201 is to convert the baseband signal from the sampling rate of 61.44 Msps to 20.48 Msps using a rate converting PFIR filter.

The step 202 is to pick one of every three points in an output result of the rate converting PFIR filter to obtain resulting data at the sampling rate of 20.48 Msps.

The step 203 is to compress the output data at the sampling rate of 20.48 Msps in the following optional schemes.

In a first scheme, an IQ signal is rounded off and bit-truncated directly into 8 bits.

In a second scheme, an IQ signal is compressed into 8 bits through A-ratio compression (compress using a nonlinear function).

In a third scheme, the amplitude and the phase of an IQ signal are firstly calculated through Cordic conversion, and then rounded off and bit-truncated respectively as in the first embodiment.

In a fourth scheme, the amplitude and the phase of an IQ signal are firstly calculated through Cordic conversion, and then the phase is rounded off and bit-truncated, and the amplitude is compressed through A-ratio compression.

The step 204 is to compress by the BBU the IQ signal, and then pass the compressed IQ signal to the RRU via an IR interface.

The step 205 is to receive by the RRU the compressed IQ signal, and then decompress it into a 16-bit IQ signal particularly as follows.

The rounded and bit-truncated data are supplemented directly with zeros at the tail thereof, the data compressed through A-ratio compression are decompressed through A-ratio decompression, and the data converted into the amplitude and phase domain through Cordic conversion are decompressed through the same Cordic conversion.

The step 206 is, after the IQ signal is recovered into 16 bits, to interpolate the IQ signal by a factor of 3, and fill two zero values, and to restore the IQ signal into 61.44 Msps using a PFIR filter to thereby integrate it onto the existing RRU link.

Figure 3:
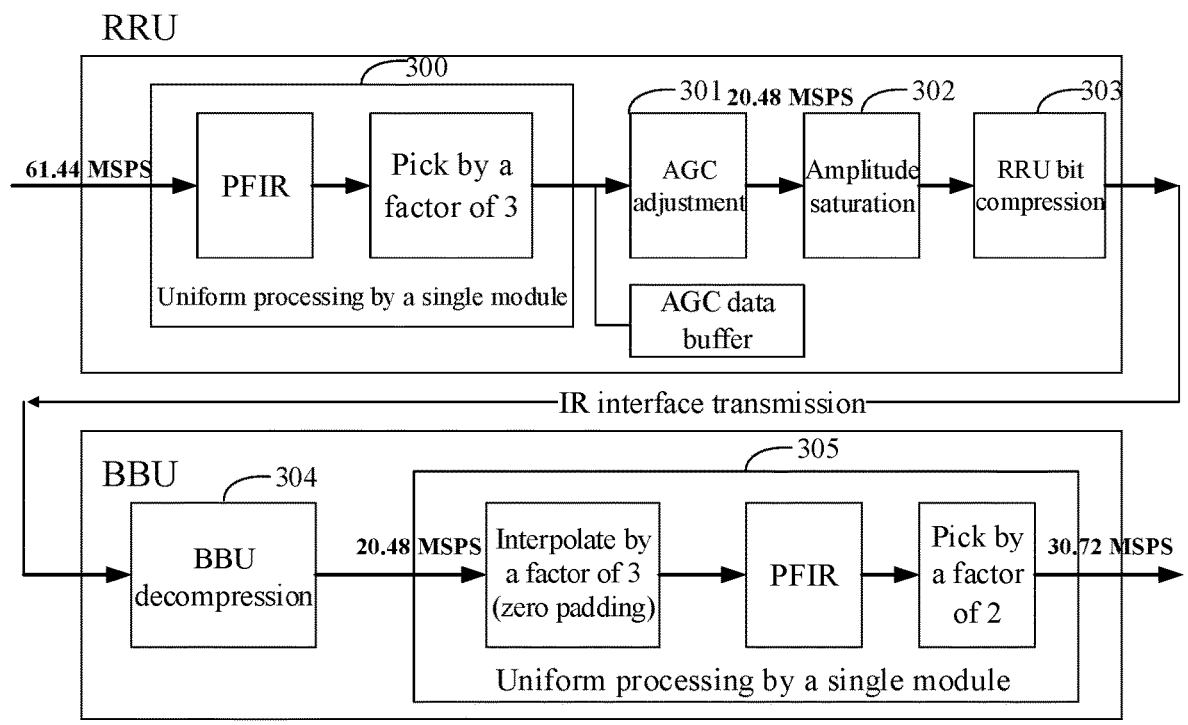
FIG. 3 is a schematic diagram of a process of compressing downlink transmission data according to an embodiment of the disclosure.

Second Scenario (Uplink Transmission):

as illustrated in FIG. 3, a process of compressing data in uplink transmission of an RRU to a BBU according to an embodiment of the disclosure is as follows.

The step 300 is to sample an input IQ signal at 61.44 Msps by a factor of 3 directly through a PFIR filter.

The step 301 is to buffer the IQ signal for a length of 128 points starting with a half of the length of a CP, starting with a start instance of time of an OFDM symbol, to make a statistics of power at these 128 points (to calculate an RMS value), and to make AGC adjustment on the RMS value, where there are the following two schemes of AGC adjustment.

In a first scheme, power adjustment to be made is determined using the RMS value and a preset power average, and the amplitude is adjusted accordingly.

In a second scheme, a power peak is set according to a peak-to-average ratio characteristic of the LTE system, and the amplitude is saturated.

The step 302 is to saturate all the data in the current OFDM symbol.

The step 303 is to round off and bit-truncate the data to obtain a corresponding compressed IQ signal, and to transmit the IQ signal to the BBU via an IR interface.

The step 304 is to receive by the BBU the compressed IQ signal, and then perform zero padding on the compressed IQ signal, thus resulting in an IQ signal at 20.48 Msps.

The step 305 is to interpolate the IQ signal at 20.48 Msps by a factor of 3, to filter an interpolation result using a PFIR filter, and to sample a filtering result by a factor of 2, thus resulting in an IQ signal at 30.72 Msps.

Figure 4:
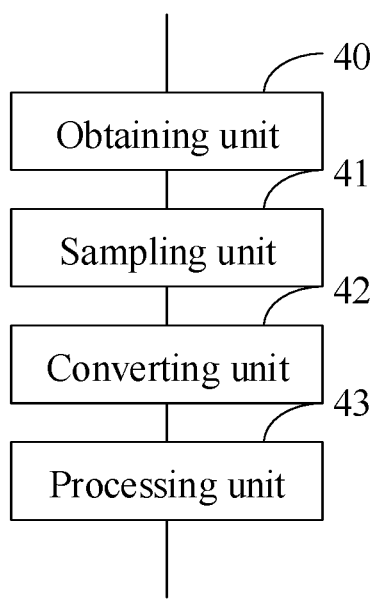
FIG. 4 is a schematic structural diagram of a device for compressing data according to an embodiment of the disclosure.

Further to the embodiment above, as illustrated in FIG. 4, a device for compressing data according to an embodiment of the disclosure includes at least an obtaining unit 40, a sampling unit 41, a converting unit 42, and a processing unit 43.

The obtaining unit 40 is configured to obtain a baseband signal.

The sampling unit 41 is configured to sample the obtained baseband signal to obtain several discrete baseband signals.

The converting unit 42 is configured to calculate the phase and the amplitude of each discrete baseband signal, and to adjust the amplitude of each discrete baseband signal respectively so that the adjusted amplitude satisfies a preset peak-to-average ratio.

The processing unit 43 is configured to perform respectively for each discrete baseband signal the operations of:

bit-truncating the phase and the adjusted amplitude corresponding respectively to each discrete baseband signal according to bit widths which are set respectively corresponding thereto, and combining the bit-truncated phase and amplitude into a compressed discrete baseband signal.

Optionally, the sampling unit 41 is configured to sample the obtained baseband signal to obtain the several discrete baseband signals by:

sampling the baseband signal at a preset sampling rate to obtain a sampling result, where the sampling rate satisfies the Nyquist's Theorem; and filtering the sampling result to obtain the several discrete baseband signals.

Optionally, the converting unit 42 is configured to calculate the phase and the amplitude of each discrete baseband signal, and to adjust the amplitude of each discrete baseband signal respectively so that the adjusted amplitude satisfies the preset peak-to-average ratio by:

converting each discrete baseband signal from the time or frequency domain into the amplitude and phase domains to obtain the corresponding phase and amplitude, determining a corresponding amplitude power average based upon the amplitude, calculating the difference between the amplitude power average and a preset power average based upon the amplitude power average and the preset power average, and scaling up or down the amplitude corresponding to the discrete baseband signal based upon the difference; or converting each discrete baseband signal from the time domain into the amplitude and phase domains to obtain the corresponding phase and amplitude, determining a corresponding amplitude power average based upon the amplitude, determining whether the amplitude power average is greater than a preset power average, and if so, saturating the amplitude power average of the discrete baseband signal, and adjusting the corresponding amplitude; otherwise, maintaining the amplitude corresponding to the discrete baseband signal.

Optionally, before the phase and the adjusted amplitude of each discrete baseband signal are bit-truncated respectively, the processing unit 43 is configured:

to preprocess each discrete baseband signal to thereby maximize valid bit widths corresponding respectively to the phase and the adjusted amplitude of each discrete baseband signal.

Optionally, the processing unit 43 is configured to bit-truncate the phase and the adjusted amplitude corresponding respectively to each discrete baseband signal according to the bit widths which are set respectively corresponding thereto by:

removing a sign bit of the adjusted amplitude of each discrete baseband signal, and saturating the adjusted amplitude; and adjusting the adjusted amplitude corresponding to the discrete baseband signal, with one sign bit according to the bit width which is set for the adjusted amplitude, bit-truncating lower bits of the adjusted amplitude from which the sign bit is removed, according to the adjusted bit width, and to bit-truncate the phase of the discrete baseband signal according to the bit width which is set for the phase of the discrete baseband signal.

Optionally, the processing unit 43 configured to remove the sign bit of the adjusted amplitude of the discrete baseband signal, and to saturate the adjusted amplitude is configured:

determining whether the adjusted amplitude of the discrete baseband signal overflows after the sign bit is removed, and if so, determining the adjusted amplitude from which the sign bit is removed, as the overflowing amplitude which is saturated; otherwise, not processing the adjusted amplitude.

In summary, in the embodiments of the disclosure, firstly an obtained baseband signal is sampled, and several discrete baseband signals are obtained, so that the baseband signal can be compressed for the first time without being distorted; then the amplitude and the phase of each discrete baseband signal are calculated, and the amplitude is adjusted based upon a preset peak-to-average ratio while maintaining the phase; and next the adjusted amplitude and the phase are bit-truncated respectively according to bit widths which are preset for the adjusted amplitude and the phase, and bit-truncated phase data and amplitude data are combined into a compressed discrete baseband signal, so that the amplitude and the phase of each discrete baseband signal can be bit-truncated according to their preset bit widths without being distorted, to thereby reduce the number of data bits in the baseband signal so as to reduce the amount of data to be transmitted, and to improve in effect the compression efficiency, thus saving optic fiber resources, and achieving compatibility with the existing TD-LTE system or 5G system. In this way, the existing communication system architecture will not be modified, thus saving the cost.

Those skilled in the art shall appreciate that the embodiments of the disclosure can be embodied as a method, a system or a computer program product. Therefore the disclosure can be embodied in the form of an all-hardware embodiment, an all-software embodiment or an embodiment of software and hardware in combination. Furthermore the disclosure can be embodied in the form of a computer program product embodied in one or more computer useable storage mediums (including but not limited to a disk memory, a CD-ROM, an optical memory, etc.) in which computer useable program codes are contained.

The disclosure has been described in a flow chart and/or a block diagram of the method, the device (system) and the computer program product according to the embodiments of the disclosure. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flow chart and/or the block(s) of the block diagram.

These computer program instructions can also be stored into a computer readable memory capable of directing the computer or the other programmable data processing device to operate in a specific manner so that the instructions stored in the computer readable memory create an article of manufacture including instruction means which perform the functions specified in the flow(s) of the flow chart and/or the block(s) of the block diagram.

These computer program instructions can also be loaded onto the computer or the other programmable data processing device so that a series of operational steps are performed on the computer or the other programmable data processing device to create a computer implemented process so that the instructions executed on the computer or the other programmable device provide steps for performing the functions specified in the flow(s) of the flow chart and/or the block(s) of the block diagram.

Although the embodiments of the disclosure have been described, those skilled in the art benefiting from the underlying inventive concept can make additional modifications and variations to these embodiments. Therefore the appended claims are intended to be construed as encompassing the embodiments and all the modifications and variations coming into the scope of the disclosure.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A method for compressing data, the method comprising:
   obtaining a baseband signal;
   sampling obtained baseband signal to obtain several discrete baseband signals;
   calculating a phase and an amplitude of each of the discrete baseband signals, and adjusting the amplitude of each of the discrete baseband signals respectively so that adjusted amplitude satisfies a preset peak-to-average ratio; and
   performing respectively for each of the discrete baseband signals operations of:
   bit-truncating the phase and the adjusted amplitude corresponding respectively to each of discrete baseband signals according to bit widths which are set respectively corresponding to the phase and the adjusted amplitude, and combining bit-truncated phase and bit-truncated amplitude into a compressed discrete baseband signal.

2. The method according to claim 1, wherein sampling the baseband signal to obtain the several discrete baseband signals comprises:
   sampling the baseband signal at a preset sampling rate to obtain a sampling result, wherein the sampling rate satisfies the Nyquist's Theorem; and
   filtering the sampling result to obtain the several discrete baseband signals.

3. The method according to claim 1, wherein calculating the phase and the amplitude of each discrete baseband signal, and adjusting the amplitude of each discrete baseband signal respectively so that the adjusted amplitude satisfies the preset peak-to-average ratio comprises:
   converting each of the discrete baseband signals from a time domain into amplitude and phase domains to obtain a phase and an amplitude, determining an amplitude power average based upon the amplitude, calculating a difference between the amplitude power average and a preset power average based upon the amplitude power average and the preset power average, and scaling up or down the amplitude corresponding to each of the discrete baseband signals based upon the difference; or
   converting each of the discrete baseband signals from a time domain into amplitude and phase domains to obtain a phase and an amplitude, determining a amplitude power average based upon the amplitude, determining whether the amplitude power average is greater than a preset power average, and if so, saturating the amplitude power average of each of the discrete baseband signals, and adjusting the amplitude; otherwise, maintaining the amplitude corresponding to each of the discrete baseband signals.

4. The method according to claim 1, wherein before bit-truncating the phase and the adjusted amplitude of each of the discrete baseband signals respectively, the method further comprises:
   preprocessing each of the discrete baseband signals to thereby maximize valid bit widths corresponding respectively to the phase and the adjusted amplitude of each of the discrete baseband signals.

5. The method according to claim 1, wherein bit-truncating the phase and the adjusted amplitude corresponding respectively to each of the discrete baseband signals according to the bit widths which are set respectively corresponding the phase and the adjusted amplitude comprises:
   removing a sign bit of the adjusted amplitude of each of the discrete baseband signals, and saturating the adjusted amplitude; and
   adjusting the adjusted amplitude corresponding to each of the discrete baseband signals, with one sign bit according to the bit width which is set for the adjusted amplitude, bit-truncating lower bits of the adjusted amplitude from which the sign bit is removed, according to the adjusted bit width, and bit-truncating the phase of each of the discrete baseband signals according to the bit width which is set for the phase of each of the discrete baseband signal.

6. The method according to claim 5, wherein removing the sign bit of the adjusted amplitude of each of the discrete baseband signals, and saturating the adjusted amplitude comprises:
   determining whether the adjusted amplitude of each of the discrete baseband signals overflows after the sign bit is removed, and if so, determining a saturation value corresponding to overflowing amplitude as the adjusted amplitude from which the sign bit is removed; otherwise, not processing the adjusted amplitude.

7. A device for compressing data, the device comprising a memory configured to store a computer readable program, and a processor configured to execute the computer readable program to:

obtain a baseband signal;

sample obtained baseband signal to obtain several discrete baseband signals;

calculate a phase and an amplitude of each of the discrete baseband signal, and to adjust the amplitude of each of the discrete baseband signal respectively so that adjusted amplitude satisfies a preset peak-to-average ratio; and perform respectively for each of the discrete baseband signals operations of:

bit-truncating the phase and the adjusted amplitude corresponding respectively to each of the discrete baseband signals according to bit widths which are set respectively corresponding to the phase and the adjusted amplitude, and combining the bit-truncated phase and amplitude into a compressed discrete baseband signal.

8. The device according to claim 7, wherein the processor is configured to execute the computer readable program to sample the obtained baseband signal to obtain the several discrete baseband signals by:

sampling the baseband signal at a preset sampling rate to obtain a sampling result, wherein the sampling rate satisfies the Nyquist's Theorem; and filtering the sampling result to obtain the several discrete baseband signals.

9. The device according to claim 7, wherein the processor is configured to execute the computer readable program to calculate the phase and the amplitude of each of the discrete baseband signals, and to adjust the amplitude of each discrete baseband signal respectively so that the adjusted amplitude satisfies the preset peak-to-average ratio by:

converting each of the discrete baseband signals from a time or frequency domain into amplitude and phase domains to obtain the phase and amplitude, determining an amplitude power average based upon the amplitude, calculating a difference between the amplitude power average and a preset power average based upon the amplitude power average and the preset power average, and scaling up or down the amplitude corresponding to each of the discrete baseband signal based upon the difference; or converting each of the discrete baseband signal from a time domain into amplitude and phase domains to obtain the phase and amplitude, determining an amplitude power average based upon the amplitude, determining whether the amplitude power average is greater than a preset power average, and if so, saturating the amplitude power average of the discrete baseband signal, and adjusting the amplitude; otherwise, maintaining the amplitude corresponding to each of the discrete baseband signal.

10. The device according to claim 7, wherein before the phase and the adjusted amplitude of each discrete baseband signal are bit-truncated respectively, the processor is configured execute the computer readable program to:

preprocess each of the discrete baseband signal to thereby maximize valid bit widths corresponding respectively to the phase and the adjusted amplitude of each of the discrete baseband signals.

11. The device according to claim 7, wherein the processor is configured to execute the computer readable program to bit-truncate the phase and the adjusted amplitude corresponding respectively to each of the discrete baseband signals according to the bit widths which are set respectively corresponding the phase and the adjusted amplitude by:

removing a sign bit of the adjusted amplitude of each of the discrete baseband signals, and saturating the adjusted amplitude; and adjusting the adjusted amplitude corresponding to each of the discrete baseband signals, with one sign bit according to the bit width which is set for the adjusted amplitude, bit-truncating lower bits of the adjusted amplitude from which the sign bit is removed, according to the adjusted bit width, and bit-truncating the phase of each of the discrete baseband signals according to the bit width which is set for the phase of each of the discrete baseband signal.

12. The device according to claim 11, wherein the processor is configured to execute the computer readable program to remove the sign bit of the adjusted amplitude of each of the discrete baseband signal, and to saturate the adjusted amplitude by:

determining whether the adjusted amplitude of each of the discrete baseband signal overflows after the sign bit is removed, and if so, determining a saturation value corresponding to an overflowing amplitude as the adjusted amplitude from which the sign bit is removed; otherwise, not to processing the adjusted amplitude.

\* \* \* \* \*